United States Patent [19]

Hatano et al.

[11] 4,187,205

[45] Feb. 5, 1980

[54] RADIATION-SENSITIVE COMPOSITION

[75] Inventors: Yoshio Hatano, Hachioji; Saburo Nonogaki, Tokyo; Shinkichi Horigome, Tachikawa; Shungo Sugawara, Mito, all of Japan

[73] Assignees: Nippon Telegraph and Telephone Public Corporation; Hitachi, Ltd., both of Japan

[21] Appl. No.: 877,866

[22] Filed: Feb. 15, 1978

[30] Foreign Application Priority Data

Feb. 18, 1977 [JP] Japan ................... 52/16232

[51] Int. Cl.$^2$ ............ 260 45.9 D; C08K 5/34; C08K 5/13; C08K 5/08
[52] U.S. Cl. ............ 260/30.4 A; 260/31.2 MR; 260/45.8 N; 260/45.8 NW; 260/45.7 R; 260/45.95 R; 260/45.95 G
[58] Field of Search ............ 260/45.8 NW, 45.9 D, 260/45.7 R, 45.95 B, 45.8 N, 30.4 A, 31.2 MR, 45.95 G

[56] References Cited

U.S. PATENT DOCUMENTS

| 2,907,742 | 10/1959 | Frey et al. | 260/45.95 E |
| 3,063,961 | 11/1962 | Frank | 260/45.8 NW |
| 3,341,491 | 12/1967 | Robinson et al. | 260/45.75 V |
| 3,417,069 | 12/1968 | Davis et al. | 526/56 |
| 3,629,110 | 12/1971 | Hunt | 260/45.8 NW |

OTHER PUBLICATIONS

Applied Polymer Symposium—No. 23; pp. 117–123, (1974), Nonogaki et al.

Primary Examiner—Veronica P. Hoke
Attorney, Agent, or Firm—Craig and Antonelli

[57] ABSTRACT

A radiation-sensitive composition comprising a radiation-sensitive polymer which has in its molecule a plurality of epoxy groups and a plurality of bromine atoms, and at least one stabilizer which is selected from the group consisting of compounds having stable free radicals, polymerization inhibitors, ketone-amine reaction products, and phenol derivatives. Even when the composition is preserved for a long term, the characteristics do not change.

4 Claims, 4 Drawing Figures

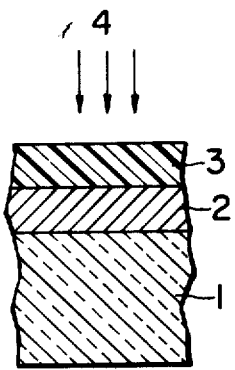
FIG. IA
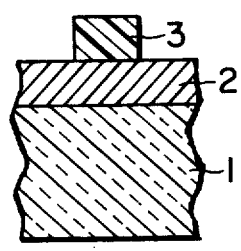
FIG. IB
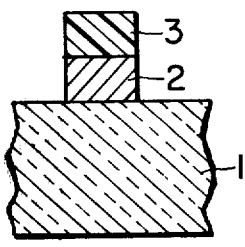
FIG. IC
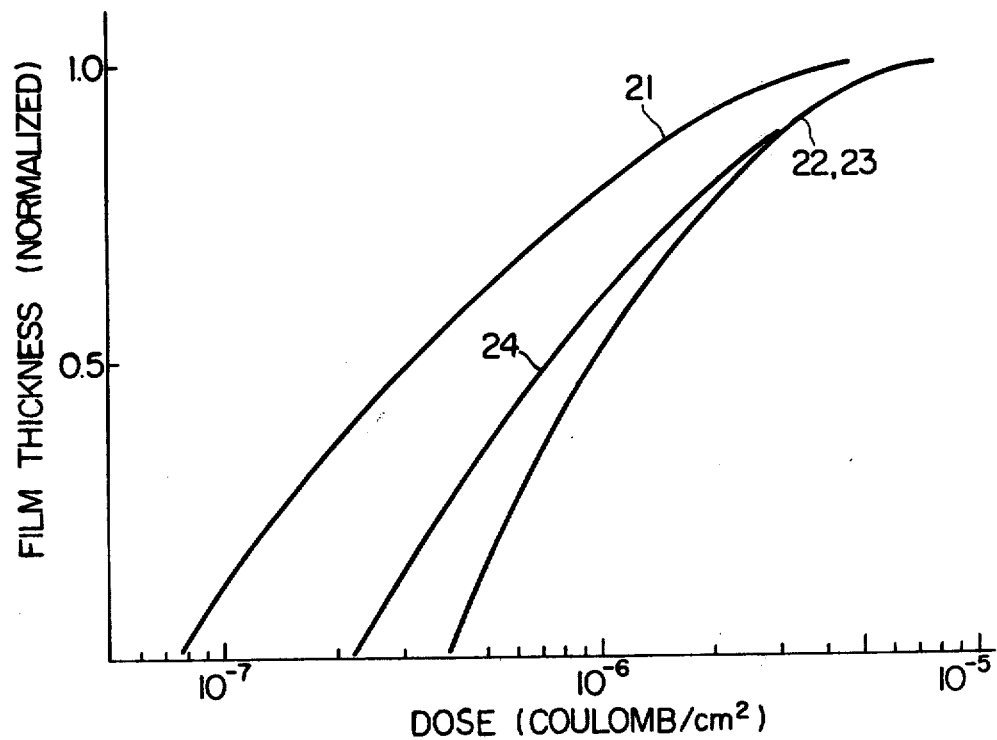
FIG. 2

4,187,205

RADIATION-SENSITIVE COMPOSITION

BACKGROUND OF THE INVENTION

This invention relates to improvements in an organic polymeric material which exhibits a high sensitivity and a high contrast characteristic to radiations such as electron beams, ion beams, γ-rays, neutron beams and X-rays. More particularly, it relates to a novel composition free from instability.

The term "instability" is intended to mean the insolubility (spontaneous insolubilization) of unirradiated parts of the polymeric material.

As is well known, electron beam-sensitive organic polymers are noticed as materials to replace photosensitive resins and are being put into practical use as, for example, resist materials. The resist materials are broadly classified into a photo resist exploiting photosensitivity, and an electron-beam resist exploiting electron-beam sensitivity. A deep-UV resist, an X-ray resist or the electron-beam resist is noticed in that a precision working is possible.

Some of the inventors have previously proposed as a material of this type a radiation-sensitive material which comprises a polymeric material having a plurality of epoxy groups and a plurality of bromine atoms in one molecule thereof (Japanese Patent Application No. 51-16029, corresponding U.S. Patent Application Ser. No. 768,728 filed on Feb. 15, 1977).

This radiation-sensitive material is made of at least one polymeric material selected from the group consisting of brominated and epoxidized polymers of butadiene, brominated and epoxidized copolymers of butadiene, brominated and epoxidized polymers of isoprene, brominated and epoxidized copolymers of isoprene, brominated products of copolymers of butadiene with addition-polymerizable compounds containing an epoxy group, brominated products of copolymers of isoprene with addition-polymerizable compounds containing an epoxy group and epoxidized products of copolymers of one of butadiene and isoprene with addition-polymerizable compounds containing a bromine atom.

The polymeric materials can be produced by subjecting a polymer or copolymer containing a plurality of carbon-to-carbon double bonds in one molecule, such as polybutadiene, polyisoprene, a butadiene copolymer or an isoprene copolymer, to addition of bromine and epoxidation in succession or simultaneously, or by subjecting a copolymer of a diene compound with an epoxy group-containing, addition-polymerizable monomer to bromination. The procedures for producing these polymeric materials, as well as the characteristics of these materials, are described in greater detail in the heretofore mentioned application Ser. No. 768,728, the disclosure of which is incorporated by reference.

The polymeric materials have high sensitivity, high resolution and high contrast characteristics as the radiation-sensitive materials. Owing to the high sensitivity, they are useful as recording materials in the field of recording information.

An example of the case of employing the radiation-sensitive materials as electron-beam resists will be explained with reference to FIGS. 1-A to 1-C.

As shown in FIG. 1-A, a metallic evaporated film 2 is formed on a glass substrate 1, and a coating film 3 of the radiation-sensitive material is formed thereon by applying a resist solution containing the radiation-sensitive material and an appropriate solvent. A part of the coating film 3 is irradiated by an electron beam 4 in a suitable dose, whereupon the coating film is treated with a proper organic solvent (liquid developer). Then, that part of the coating film which has not been subjected to the irradiation by the electron beam is dissolved and removed, and only that part of the coating film which has insolubilized owing to the irradiation by the electron beam remains without being dissolved in the solvent, so that a state illustrated in FIG. 1-B is attained. The structure in this state is further treated with chemicals which etch the metallic evaporated film 2, thereby to obtain a structure in a state shown in FIG. 1-C wherein only the metallic evaporated film in an area corresponding to the remaining part of the coating film 3 is left and wherein the metallic evaporated film in the other area is dissolved and removed. In this way, a glass plate in which the metallic evaporated film remains only in the area irradiated by the electron beam can be obtained. If, in the irradiation by the electron beam, a certain pattern is depicted on the polymer coating film with the electron beam, the metallic evaporated film will remain according to the depicted pattern on the glass substrate after the step of etching the metallic evaporated film. Using an electron-beam depicting equipment and the electron-beam resist in this manner, even a complicated and very fine pattern can be worked extremely precisely, and a metallic evaporated film of any desired design can be obtained. When a sample and a mask are held in close contact and they are irradiated by electromagnetic waves of short wavelengths, e.g. X-rays, a complicated and very fine pattern can be worked extremely precisely and a metallic evaporated film of any desired design can be obtained likewise to the above.

It has been revealed, however, that when the polymeric material containing epoxy groups and bromine atoms that has been let to stand after the synthesis is applied in conformity with the steps of FIGS. 1-A to 1-C, a phenomenon in which the width of a line irradiated by an electron beam becomes somewhat greater can take place. It has also been revealed that the resist solution undergoes insolubilization little by little also when let to stand, that the viscosity and sensitivity of the resist solution rise with the insolubilization, and that when the insolubilization becomes more conspicuous, a phenomenon in which the entire solution solidifies can take place.

That is, in case where, by way of example, a structure in the state of FIG. 1-B is to be obtained by irradiating the desired part of the coating film 3 in FIG. 1-A with the electron beam and thereafter conducting the developing treatment with the organic solvent, the sensitivity can become different depending on the date of irradiation, the degree of fog and, accordingly, the width of a line can become different depending on the developing period of time, or a fog film can appear in an unirradiated area. Such fogging phenomena give rise to the instability of the operations, and become a very serious problem in the technological field of semiconductor devices requiring precise working, especially in the field of integrated circuits (IC's), magnetic bubble domain memories, etc. requiring high working precisions in complicated microcircuits. A method for preventing such fogging phenomena must be taken by all means.

The phenomenon in which the organic polymer coating film in the unirradiated area or the resist solution becomes insoluble, as described above, is usually called the "spontaneous insolubilization" or "instability". Although the mechanism by which the phenomenon is caused is not clear, the most important cause will be that the polymeric material being the resist material is dissolved little by little, induces cross linkage in any form and consequently affects the fog.

SUMMARY OF THE INVENTION

An object of this invention is to provide a radiation-sensitive composition free from the "instability".

This and other objects of this invention is accomplished by a radiation-sensitive composition comprising a radiation-sensitive polymer which has a plurality of epoxy groups and a plurality of bromine atoms in one molecule, and at least one stabilizer which is selected from the group consisting of compounds having stable-free radicals, polymerization inhibitors, ketone-amine reaction products and phenol derivatives.

BRIEF DESCRIPTION OF THE DRAWINGS

FIGS. 1-A, 1-B and 1-C are views for explaining a case where a radiation-sensitive polymer is employed as an electron-beam resist, and FIG. 2 is a graph showing the electron-beam sensitivity characteristics of radiation-sensitive compositions.

DETAILED DESCRIPTION OF THE PREFERRED EMBODIMENTS

The inventors introduced a variety of additives as stabilizers into radiation-sensitive polymers. Then, it has been found out that compounds having stable free radicals, polymerization inhibitors, ketone-amine reaction products or phenol derivatives which have solubilities to organic substances exhibit particularly excellent "instability" preventing- or suppressing-effects. Accordingly, the radiation-sensitive composition of this invention is characterized in that the stabilizers are added to the polymeric material. Thus, the "instability" can be easily prevented without any degradation of the sensitivities of the polymeric material to radiations such as electron beams, ion beams, γ-rays, neutron beams and X-rays, and extraordinarily stabilized resist materials can be obtained.

The mechanism of the instability preventing-effect is not definite. However, since the instability preventing-effect is is attained by adding compounds having stable free radicals, polymerization inhibitors, ketone-amine reaction products or phenol derivatives as stabilizers, it is considered that the polymeric material being the resist material will be dissolved little by little to generate radicals and that the active radicals will cause the instability. It is considered that the active radicals will be inactivated by adding the additives as mentioned above, with the result that the cross linkage of the polymers will be impeded.

As the compounds having stable free radicals, there are 2,2-diphenyl-1-picrylhydrazyl; α,γ-bisdiphenylene-β-phenylallyl; etc. As the polymerization inhibitors, there are quinones of hydroquinone monomethyl ether; benzoquinone; methylquinone; 2,5-dimethylquinone; thymoquinone; trimethylquinone; tetramethylquinone; chloranil; 1,4-naphthoquinone; phenanthraquinone; chrysenequinone; 2-methoxyquinone; 2-chlorobenzoquinone; dichlorobenzoquinone; methylnaphthoquinone; dichloronaphthoquinone; anthraquinone; 2-tert-butylanthraquinone; etc. As the ketone-amine reaction products, there are mentioned, for example, polymerization products of 2,2,4-trimethyl-1,2-dihydroquinoline, and quinoline derivatives of 6-ethoxy-2,2,4-trimethyl-1,2-dihydroquinoline; 6-dodecyl-2,2,4-trimethyl-1,2-dihydroquinoline. As the phenol derivatives, there are mentioned, for example, 4,4'-dioxydiphenyl; dioxydiphenyl methane derivatives; and 1,1-bis-(4-hydroxyphenyl)-cyclohexane.

As a method for adding the stabilizer to the polymer, i.e. high molecular weight compound, the stabilizer may be dissolved in an organic solvent before the high molecular compound is dissolved in the solvent. Alternatively, the stabilizer may be dissolved simultaneously with the high molecular compound or may be dissolved in a solution in which the high molecular compound is dissolved in advance. With all the methods, substantially equal effects are achieved. To be noted at the time of the addition is to sufficiently dissolve the additive so that it may not exist in the solution in the solid state. Even when the quantity of addition of the stabilizer is slight, the corresponding effect is noticed. In general, as the quantity of addition is larger, the effect is more remarkable. When the additive is added in large quantities, it is sometimes precipitated on a coating film. It is therefore necessary to confine the quantity of addition to the extent that no precipitation occurs. The precipitation of the additive on the coating film becomes a cause for generating pinholes in the coating film and lowers the accuracy of etching, so that it must be avoided. Regarding the quantity of the additive, accordingly, a preferable range is 0.01% to 5%, with respect to the quantity of the high molecular compound.

The high molecular compound which is applied to this invention comprises at least one polymeric material selected from the group consisting of brominated and epoxidized polymers of butadiene, brominated and epoxidized copolymers of butadiene, brominated and epoxidized polymers of isoprene, brominated and epoxidized copolymers of isoprene, brominated products of copolymers of butadiene with addition-polymerizable compounds containing an epoxy group, brominated products of copolymers of isoprene with addition-polymerizable compounds containing an epoxy group and epoxidized products of copolymers of one of butadiene and isoprene with addition-polymerizable compounds containing a bromine atom.

As the polymers of butadiene, there may be employed any of 1,2-polybutadiene, 1,4-polybutadiene, polybutadienes having both the 1,2- and 1,4-structures and mixtures thereof. The same applies to the polymers of isoprene. As the copolymers of butadiene, there can be used known butadiene copolymers such as styrene-butadiene copolymers and butadiene-isoprene copolymers. Likewise, known isoprene copolymers can be used as the copolymers of isoprene. Further, as the epoxy group-containing, addition-polymerizable monomers, there are glycidyl acrylate, glycidyl methacrylate, etc.

A preferred degree of epoxidation is about 10% to about 70%, and a preferred degree of bromination is about 7% to about 50%. The "degree of epoxidation or bromination" means the ratio of the epoxidized or brominated monomer units in the polymer or copolymer to the total monomer units. The calculation of the degree of epoxidation or bromination is made based on the supposition that one monomer unit is epoxidized by one atom of oxygen or that one monomer unit is brominated by two atoms of bromine. Since either reaction of epoxidation and bromination takes place on one monomer unit, the value of the sum of the degree of epoxidation and the degree of bromination is always lower than 100%.

A preferable range of the molecular weight of the high molecular compound is about 500 to about 10,000,000. A more preferable range is about 100,000 to 2,000,000. These values of the molecular weight are measurements by the viscosity process.

As a liquid developer to be used when the radiation-sensitive composition of this invention is employed as an electron-beam resist, there can be used any solvent capable of dissolving the composition and incapable of dissolving a radiation-crosslinked product of the high molecular compound. Among such solvents, dioxane, butyl acetate or a mixed solvent containing dioxane or butyl acetate, for example, butyl acetate-ethyl cellosolve or dioxane-ethyl cellosolve is an excellent liquid developer.

When the composition of this invention is employed as, e.g., an electron-beam resist in the fabrication of a photo-resist mask for manufacturing a semiconductor device, a mask of extraordinarily high working precision can be made. When the surface of a coating film of the composition of this invention is scanned by an electron beam directly without any mask, a resist film of desired shape having an extraordinarily high working precision can be formed, and this technique can be put into practical use instead of the conventional photolithography in the field of semiconductor technology. Further, the composition of this invention can be satisfactorily used as a recording material for the recording of a very fine pattern, the high-density picture recording, the electron-beam holography or the X-ray holography.

Hereunder, this invention will be described more concretely with reference to examples.

In all of the following examples, in order to know the extent of "instability", the electron-beam sensitivity after a solution of the radiation-sensitive composition has been let to stand for a certain time is indicated, or the solubility to a solvent after a coating film has been let to stand for a certain time is indicated.

EXAMPLE 1

To 50 ml of monochlorobenzene was added 1.5 g of 1,2-polybutadiene (RB 820 manufactured by Japan Synthetic Rubber Co.; having a 1,2-structure content of about 82%, a 1,4-structure content of about 18% and a molecular weight of about 160,000), and the mixture was heated to form a homogeneous solution. At the room temperature, to the solution was added an acetic acid solution of peracetic acid in an amount sufficient to epoxidize all the double bonds of the 1,2-polybutadiene, and the mixture was agitated for 2 hours to effect epoxidation of the 1,2-polybutadiene.

The acetic acid solution of peracetic acid used for the epoxidation was prepared in the following manner. 0.20 ml of concentrated sulfuric acid, 22 ml of glacial acetic acid and 4.1 ml of 30% aqueous hydrogen peroxide were mixed together, and the mixture was let to stand still at the room temperature overnight. 3.0 g of sodium acetate trihydrate was added to and dissolved in the mixture. The resulting precipitate of sodium sulfate was removed to obtain an acetic acid solution of peracetic acid, which contained about 1.1 moles per liter of peracetic acid.

While the reaction mixture under such state was agitated continuously, a solution of 2.3 g of potassium bromide (containing bromine in an amount sufficient to add to 35% of the original double bonds in the starting 1,2-polybutadiene) in 7 ml of water was added to the reaction mixture. By reaction of potassium bromide with peracetic acid left in the reaction mixture, bromine was generated and the color of the reaction mixture became brown. However, by the reaction of addition to the double bonds of the 1,2-polybutadiene the bromine was gradually consumed and was completely consumed at last, and the reaction mixture became colorless.

The reaction mixture was washed twice with about 200 ml of water and 2.0 g of sodium bicarbonate was added to the reaction mixture to neutralize remaining acetic acid and a minute amount of peracetic acid. Then, 25 ml of cyclohexane was added to the reaction mixture and the resulting mixture was subjected to centrifugal separation to recover a transparent supernatant. 50 ml of cyclohexane was added to the supernatant to precipitate the resulting polymeric compound. The polymeric compound was dissolved in 20 ml of monochlorobenzene to form a homogeneous solution.

This solution is a monochlorobenzene solution of brominated epoxidized 1,2-polybutadiene. The fact that 1,2-polybutadiene has been epoxidized and brominated according to the above method can be confirmed from the fact that an absorption peak at a wave number of 830 $cm^{-1}$ inherent to the epoxy group and an absorption peak at a wave number of 600 $cm^{-1}$ inherent to the carbon-to-bromine bond appear in the infrared absorption spectrum of the product. The degree of epoxidation of the high molecular compound is about 18%, and the degree of bromination is about 35%.

The monochlorobenzene solution of the brominated epoxidized 1,2-polybutadiene was divided into two parts. 1 weight-% of 2,2-diphenyl-1-picrylhydrazyl as based on the weight of the polymer was added as a stabilizer to one of the divided parts, to obtain a homogeneous mixed solution and the other part was retained with the addition of a stabilizer. After allowing the two types of solutions to stand at the room temperature for 50 days, the electron-beam sensitivity characteristics of these resist materials were measured as follows. Each solution was spin-coated and dried on an oxidized silicon wafer to form a polymer film having a thickness of 0.3 to 0.6 $\mu$m. The coated wafer was placed in an electron beam exposure apparatus and was irradiated in vacuum with an electron beam having an acceleration voltage of 15 KV, while the dose was varied. Then, the coated wafer was taken out of the apparatus and dipped in a developer for 2 minutes to effect development, the developer consisting of n-butyl acetate and ethyl cellosolve at a volumetric ratio of 3:2. Thereafter, the developer was removed by hot air drying, and the thickness of the polymer film insolubilized by exposure to the electron beam and left on the surface of the silicon wafer was measured by an interference microscope. The thickness of the film left after the development was plotted with respect to the electron beam dose, to obtain a diagram representative of the electron-beam sensitivity characteristic.

The electron-beam sensitivity characteristics thus obtained are shown as curves 21 and 22 in FIG. 2. The curve 21 is the sensitivity curve of the radiation-sensitive material having no stabilizer, while the curve 22 is the sensitivity curve of the radiation-sensitive composition containing the stabilizer. For reference, the electron-beam sensitivity characteristic of the brominated epoxidized 1,2-polybutadiene with no stabilizer added thereto as measured immediately after the synthesis is shown as a curve 23 in FIG. 2.

As apparent from FIG. 2, the radiation-sensitive material with no stabilizer added thereto has the sensitivity made approximately three times higher at a crosslinked film thickness of 50% when allowed to stand at the room temperature for 50 days after the synthesis. It is also understood that, since the gradient of the sensitivity curve worsens, a low contrast characteristic is exhibited.

On the other hand, the curves 22 and 23 agree perfectly, and the radiation-sensitive composition in which 1 weight-% of 2,2-diphenyl-1-picrylhydrazyl, based on the polymer, is added as the stabilizer has no sensitivity change even when allowed to stand at the room temperature for 50 days. It is also appreciated that, since the gradient of the sensitivity curve does not change, a remarkable stabilizing effect is achieved.

EXAMPLE 2

A radiation-sensitive composition was prepared by using the same solution of brominated epoxidized 1,2-polybutadiene as in Example 1 and adding 0.1 weight-% of 2,2-diphenyl-1-picrylhydrazyl as based on the quantity of polymer in solution. After allowing this composition to stand at the room temperature for 30 days, measurements were made by the same method as in Example 1. As the result, quite the same sensitivity curve as the curve 22 in FIG. 2 was obtained. It is understood from this fact that the composition has a stabilizing effect due to the presence of the stabilizer.

EXAMPLE 3

A radiation-sensitive composition was prepared by using the same solution of brominated epoxidized 1,2-polybutadiene as in Example 1 and adding 0.01 weight-% of 2,2-diphenyl-1-picrylhydrazyl as based on the quantity of the polymer. After letting this composition stand at the room temperature for 50 days, measurements were made by the same method as in Example 1. As the result, a sensitivity characteristic as illustrated by curve 24 in FIG. 2 was obtained. It is understood that the composition is effective insofar as it is used in a certain short period.

EXAMPLE 4

A radiation-sensitive composition was prepared by using the same solution of brominated epoxidized 1,2-polybutadiene as in Example 1 and adding 0.5 weight-% of α,γ-bisdiphenylene-β-phenylallyl based on the quantity of the polymer in solution. After allowing this composition to stand at the room temperature for 50 days, measurements were made by the same method as in Example 1. As the result, quite the same sensitivity curve as the curve 22 in FIG. 2 was obtained.

EXAMPLE 5

A radiation-sensitive composition was prepared by using the brominated epoxidized 1,2-polybutadiene synthesized by the same method as in Example 1 and adding 1 weight-% of hydroquinone monomethyl ether based on the quantity of the polymer in solution. After allowing this composition to stand at the room temperature for 30 days, it was applied on the surface of a chromium evaporated film on a glass substrate and then dried. Even when allowed to stand at the room temperature for 4 days, a coating film thus formed could be easily dissolved and removed by a liquid developer consisting of n-butyl acetate and ethyl cellosolve at a volumetric ratio of 1:1, and not any insolubilized part occurred. In contrast, a comparative example of the radiation-sensitive composition to which hydroquinone monomethyl ether was not added could not be perfectly dissolved and removed by the same developer, and it left an evident insolubilized film.

Besides the foregoing examples, similar tests were conducted using benzoquinone, etc. as stabilizers. In all the cases, the stabilizing effect was noted. It has been revealed that, as described previously, any of compounds having stable radicals or quinones, which are dissolved in organic solvents, can be used as a stabilizer in this invention.

EXAMPLE 6

A radiation-sensitive composition was prepared by using the same solution brominated epoxidized 1,2-polybutadiene as prepared in Example 1 and adding 1 weight-% of a polymerization product of 2,2,4-trimethyl-1,2-dihydroquinoline (Antigen RD manufactured by Sumitomo Chemicals Co.) based on the quantity of the polymer. After letting this composition stand at the room temperature for 30 days, measurements were made by the same method as in Example 1. As the result, quite the same sensitivity curve as the curve 22 in FIG. 2 was obtained.

EXAMPLE 7

A radiation-sensitive composition was prepared by using the same solution of brominated epoxidized 1,2-polybutadiene prepared as in Example 1 and adding 0.5 weight-% of 6-ethoxy-2,2,4-trimethyl-1,2-dihydroquinoline (Nokrak AW manufactured by Ouchi Shinko Co.) as based on the quantity of polymer. After letting this composition stand at the room temperature for 35 days, measurements were made by the same method as in Example 1. As the result, quite the same sensitivity curve as the curve 22 in FIG. 2 was obtained.

EXAMPLE 8

A radiation-sensitive composition was prepared by using the same solution brominated epoxidized 1,2-polybutadiene as prepared in Example 1 and adding 0.3 weight-% of a low-temperature reaction product between diphenyl amine and acetone (Antigen AM manufactured by Sumitomo Chemicals Co.) as based on the quantity thereof. After letting this composition stand at the room temperature for 50 days, measurements were made by the same method as in Example 1. As the result, quite the same sensitivity curve as the curve 22 in FIG. 2 was obtained.

EXAMPLE 9

A radiation-sensitive composition was prepared by using the same solution of brominated epoxidized 1,2-polybutadiene as prepared in Example 1 and 0.5 weight-% of 1,1-bis-(4-hydroxyphenyl)-cyclohexane being a phenol derivative (Antigen W manufactured by Sumitomo Chemicals Co.) as based on the quantity of polymer. After letting this composition stand at the room temperature for 50 days, measurements were made by the same method as in Example 1. As the result, quite the same sensitivity curve as the curve 22 in FIG. 2 was obtained.

EXAMPLE 10

In 50 ml of monochlorobenzene was dissolved 1.9 g of 1,4-polyisoprene (Cariflex IR 309 manufactured by Shell Chemical Corp.) to form a homogeneous solution. A solution of 3.3 g of potassium bromide (containing bromine in an amount sufficient to add to 50% of the double bonds of the 1,4-polyisoprene) in 10 ml of water was added to the above solution. The mixture was agitated sufficiently. While agitation was being continued, 32 ml of an acetic solution of peracetic acid prepared in the same manner as described in Example 1 was added to the mixture. The color of bromine formed by the reaction between peracetic and potassium bromide disappeared substantially instantaneously by addition of bromine to the double bonds of the 1,4-polyisoprene. After completion of the addition of peracetic acid, the reaction mixture was agitated for 2 hours to advance epoxidation. Subsequently, the reaction mixture was neutralized and refined by the same method as in Example 1. Finally, the polymer solution was dissolved in a mixed solution consisting of 20 ml of monochlorobenzene and 20 ml of toluene, to obtain a solution of brominated epoxidized 1,4-polyisoprene.

The electron-beam sensitivity characteristic of the brominated epoxidized 1,4-polyisoprene thus obtained was measured in the same manner as in Example 1. As the result, a crosslinked film began to remain at $2.5 \times 10^{-8}$ C/cm$^2$, and the thickness of the crosslinked film became equal to that of a coating film at $4 \times 10^{-7}$ C/cm$^2$. A radiation-sensitive composition was prepared by adding to the polymer solution, 1 weight-% of 6-ethoxy-2,2,4-trimethyl-1,2-dihydroquinoline (Nokrak AW manufactured by Ouchi Shinko Co.) as based on the quantity of the polymer. After letting this composition stand at the room temperature for 100 days, the electron-beam sensitivity of the composition was measured. As the result, quite the same values as measured immediately after the synthesis were exhibited, and it was known that no instability occurred.

EXAMPLE 11

An experiment similar to Example 7 was carried out in which the quantity of 6-ethoxy-2,2,4-trimethyl-1,2-dihydroquinoline was 5 weight-% on the basis of the polymer. In this case, the same result as in Example 7 was obtained. No pinhole appeared in the film.

In the foregoing examples, brominated substances of epoxidized 1,2-polybutadiene and epoxidized 1,4-polyisoprene have been exemplified as the radiation-sensitive materials. It has been revealed that similar effects are achieved on other materials made of brominated substances such as a copolymer of epoxidized isoprene, a copolymer between an addition-polymerizable compound having a glycidyl group and butadiene, and a copolymer between an addition-polymerizable compound having a glycidyl group and isoprene.

What is claimed is:

1. A radiation-sensitive composition comprising a radiation-sensitive polymer which contains a plurality of epoxy groups and a plurality of bromine atoms in one molecule thereof and which comprises at least one polymeric material selected from the group consisting of brominated and epoxidized homopolymers of butadiene, brominated and epoxidized copolymers of butadiene, brominated and epoxidized homopolymers of isoprene, brominated and epoxidized copolymers of isoprene, brominated products of copolymers of butadiene with addition-polymerizable compounds containing an epoxy group, brominated products of copolymers of isoprene with addition-polymerizable compounds containing an epoxy group and epoxidized products of copolymers of one of butadiene and isoprene with addition-polymerizable compounds containing a bromine atom, and at least one stabilizer which is selected from the group consisting of compounds having stable free radicals selected from the group consisting of 2,2-diphenyl-1-picrylhydrazyl and α,γ-bisdiphenylene-β-phenylallyl, polymerization inhibitors selected from the group consisting of hydroquinone monomethyl ether, benzoquinone, methylquinone, 2,5-dimethylquinone, thymoquinone, trimethylquinone, tetramethylquinone, chloranil, 1,4-naphthoquinone, phenanthraquinone, chrysenequinone, 2-methoxyquinone, 2-chlorobenzoquinone, dichlorobenzoquinone, methylnaphthoquinone, dichloronaphthoquinone, anthraquinone, and 2-tert-butylanthraquinone, ketone-amine reaction products selected from the group consisting of polymerization products of 2,2,4-trimethyl-1,2-dihydroquinoline, 6-ethoxy-2,2,4-trimethyl-1,2-dihydroquinoline and 6-dodecyl-2,2,4-trimethyl-1,2-dihydroquinoline and phenol derivatives selected from the group consisting of 4,4'-dioxydiphenyl, dioxydiphenyl methane derivatives, and 1,1-bis-(4-hydroxyphenyl)-cyclohexane.

2. A radiation-sensitive composition according to claim 1, wherein said stabilizer amounts to 0.01 to 5 weight-% with respect to the weight of said radiation-sensitive polymer.

3. A radiation-sensitive composition according to claim 1, wherein the degree of epoxidation and the degree of bromination of said radiation-sensitive polymer have values in ranges of about 10 to 70% and about 7 to 50% with respect to total monomer units in the polymer or copolymer, the sum between both the values being less than 100%.

4. A radiation-sensitive composition according to claim 1, further comprising a solvent in which the radiation-sensitive polymer is dissolved in the non-crosslinked or non-irradiated state.

* * * * *